(12) United States Patent
Qian

(10) Patent No.: US 11,903,240 B2
(45) Date of Patent: Feb. 13, 2024

(54) DISPLAY DEVICE AND PREPARATION METHOD THEREOF

(71) Applicants: Wuhan Tianma Microelectronics Co., Ltd., Wuhan (CN); Wuhan Tianma Microelectronics Co., Ltd. Shanghai Branch, Shanghai (CN)

(72) Inventor: Xingchen Qian, Wuhan (CN)

(73) Assignees: Wuhan Tianma Microelectronics Co., Ltd., Wuhan (CN); Wuhan Tianma Microelectronics Co., Ltd. Shanghai Branch, Shanghai (CN)

( * ) Notice: Subject to any disclaimer, the term of this patent is extended or adjusted under 35 U.S.C. 154(b) by 0 days.

(21) Appl. No.: 17/851,914

(22) Filed: Jun. 28, 2022

(65) Prior Publication Data

US 2022/0328791 A1 Oct. 13, 2022

(30) Foreign Application Priority Data

Nov. 30, 2021 (CN) .......................... 202111472767.0

(51) Int. Cl.
*H10K 50/844* (2023.01)
*B32B 3/04* (2006.01)
(Continued)

(52) U.S. Cl.
CPC ............. *H10K 50/844* (2023.02); *B32B 3/04* (2013.01); *B32B 5/18* (2013.01); *B32B 7/14* (2013.01);
(Continued)

(58) Field of Classification Search
CPC .... H10K 50/844; H10K 71/00; H10K 50/841; H10K 50/8426; H10K 59/1201;
(Continued)

(56) References Cited

U.S. PATENT DOCUMENTS

2019/0372033 A1\* 12/2019 Li ........................... H10K 59/12
2020/0343488 A1\* 10/2020 Huang ................. H10K 59/122
2021/0157431 A1\* 5/2021 Gu ......................... G06F 1/1652

FOREIGN PATENT DOCUMENTS

| CN | 110570754 A | 12/2019 |
| CN | 110890025 A | 3/2020 |

(Continued)

OTHER PUBLICATIONS

Machine Translation of CN 112270890 A. (Year: 2021).\*
Machine Translation of CN 111415592 A. (Year: 2020).\*

*Primary Examiner* — Brian Handville
(74) *Attorney, Agent, or Firm* — KDW Firm PLLC

(57) ABSTRACT

Provided are a display device and a preparation method thereof. The display device includes a first substrate, where the first substrate includes a display portion and a bending portion located on at least one side of the display portion; and a second substrate, where the second substrate and the first substrate are disposed opposite to each other, the second substrate includes a first region portion corresponding to the bending portion, and the bending portion is bent towards one side facing away from the second substrate. A protective layer is provided between the bending portion of the first substrate and the first region portion of the second substrate and the bending portion of the first substrate is bent towards one side of the second substrate.

13 Claims, 11 Drawing Sheets

(51) Int. Cl.
*B32B 5/18* (2006.01)
*B32B 7/14* (2006.01)
*B32B 37/12* (2006.01)
*B32B 37/18* (2006.01)
*B32B 38/00* (2006.01)
*G02F 1/1333* (2006.01)
*H10K 71/00* (2023.01)
*H10K 50/84* (2023.01)
*H10K 50/842* (2023.01)
*H10K 59/131* (2023.01)
*H10K 59/12* (2023.01)
*H10K 77/10* (2023.01)
*H10K 102/00* (2023.01)

(52) U.S. Cl.
CPC .............. *B32B 37/12* (2013.01); *B32B 37/18* (2013.01); *B32B 38/0012* (2013.01); *G02F 1/133305* (2013.01); *H10K 71/00* (2023.02); B32B 2305/022 (2013.01); B32B 2457/206 (2013.01); G02F 2201/07 (2013.01); G02F 2201/50 (2013.01); G02F 2202/28 (2013.01); H10K 50/841 (2023.02); H10K 50/8426 (2023.02); H10K 59/1201 (2023.02); H10K 59/131 (2023.02); H10K 77/111 (2023.02); H10K 2102/311 (2023.02)

(58) Field of Classification Search
CPC .............. H10K 59/131; H10K 77/111; H10K 2102/311; H10K 71/50; B32B 3/04; B32B 5/18; B32B 7/14; B32B 37/12; B32B 37/18; B32B 38/0012; B32B 2305/022; B32B 2457/206; B32B 3/30; B32B 5/142; B32B 2255/26; B32B 2457/20; B32B 7/12; G02F 1/133305; G02F 2201/07; G02F 2201/50; G02F 2202/28; G02F 1/13452; G09F 9/301; G09F 9/33; G09F 9/35
See application file for complete search history.

(56) References Cited

FOREIGN PATENT DOCUMENTS

| | | |
|---|---|---|
| CN | 210156046 U | 3/2020 |
| CN | 111415592 A | 7/2020 |
| CN | 112270890 A | 1/2021 |
| CN | 213458806 U | 6/2021 |

* cited by examiner

DISPLAY DEVICE AND PREPARATION METHOD THEREOF

CROSS-REFERENCE TO RELATED APPLICATION(S)

This application claims priority to Chinese Patent Application No. 202111472767.0 filed Nov. 30, 2021, the disclosure of which is incorporated herein by reference in its entirety.

TECHNICAL FIELD

The present disclosure relates to a field of display technologies and, in particular, to a display device and a preparation method thereof.

BACKGROUND

Recently, with the development of display technologies, more and more display screens are applied to various fields, but a main factor limiting the display screens to be extensively used is a low assembly yield of flexible modules.

In the module preparation process, due to numerous assembly stations and improper personnel operation, there will be many micro-cracks in the bending portion, which can cause the problem of wiring breakage.

SUMMARY

Embodiments of the present disclosure provide a display device and a preparation method thereof.

In a first aspect, an embodiment of the present disclosure provides a display device. The display device includes a first substrate, a second substrate and a protective layer.

The first substrate includes a display portion and a bending portion located on at least one side of the display portion.

The second substrate and the first substrate are disposed opposite to each other, the second substrate includes a first region portion corresponding to the bending portion, and the bending portion is bent towards one side facing away from the second substrate.

The protective layer is located at least between the bending portion and the first region portion, and a first end of the protective layer is separated from the bending portion and/or the first region portion.

In a second aspect, an embodiment of the present disclosure provides a preparation method of a display device. The preparation method includes the steps described below.

A first substrate is provided. The first substrate includes a display portion and a bending portion located on at least one side of the display portion.

A second substrate is provided. The second substrate includes a first region portion corresponding to the bending portion.

A protective layer is attached to the bending portion or the first region portion.

The first substrate is opposed to the second substrate, and the bending portion is bonded to the first region portion by the protective layer.

The bending portion is bent towards one side of the first substrate facing away from the second substrate, and at least part of the protective layer is separated from the first region portion and/or the bending portion.

DETAILED DESCRIPTION

Figure 1:
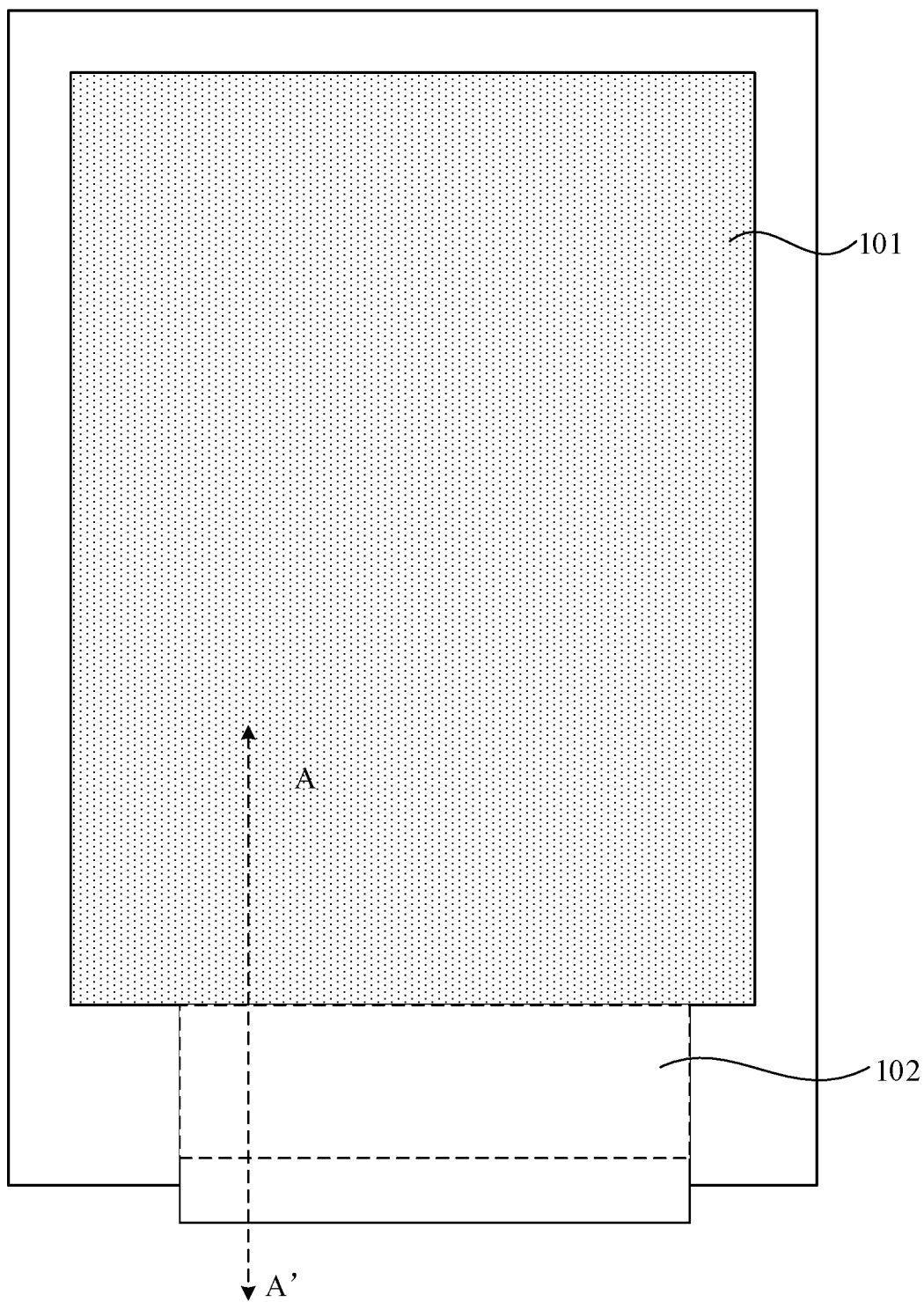
FIG. 1 is a top view of a display device in the related art.

The present disclosure is further described hereinafter in detail in conjunction with drawings and embodiments. It is to be understood that embodiments described hereinafter are intended to explain the present disclosure and not to limit the present disclosure. Additionally, it is to be noted that for ease of description, only portion, not all, of structures related to the present disclosure are illustrated in the drawings. It is obvious for those skilled in the art that various modifications and changes in the present disclosure may be made without departing from the spirit or scope of the present disclosure. Accordingly, the present disclosure is intended to cover modifications and variations of the present disclosure that fall within the scope of the corresponding claims (the claimed technical solutions) and their equivalents.

It is to be noted that embodiments of the present disclosure, if not in collision, may be combined with each other.

Figure 2:
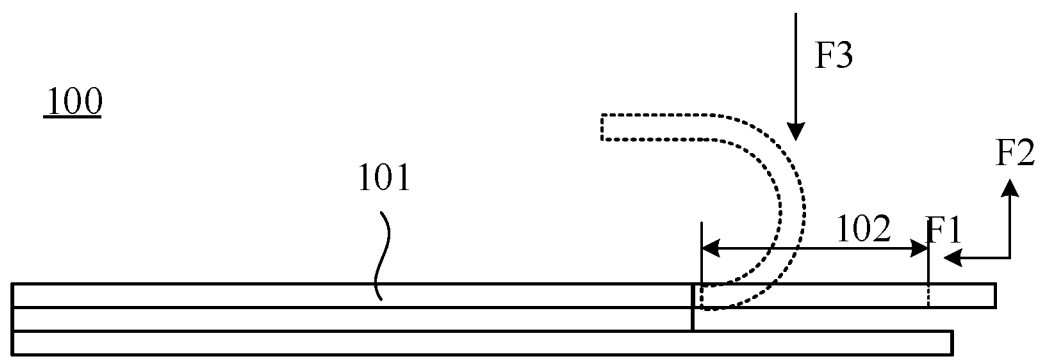
FIG. 2 is a sectional view of a display device taken along a direction AA' in FIG. 1.

FIG. 1 is a top view of a display device in the related art. FIG. 2 is a sectional view of a display device taken along a direction AA' in FIG. 1. With reference to FIGS. 1 and 2, to reduce the frame of the display device, in the related art, the display device adopts a flexible substrate, and the display device 100 includes a display portion 101 and a bending portion 102 located on one side of the display portion 101. Multiple traces are disposed on the bending portion 102, and in a preparation process of a flexible module, since the bending portion 102 is relatively fragile, the bending portion 102 needs to maintain at a certain radian in a case where the bending portion 102 is bent, which may cause the bending portion to be deformed so as to generate cracks, and when the operator pulls the bending portion, the bending portion may be deform due to forces in F1 and F2 directions so as to generate the cracks. The above situations have the risk of trace breakage in the bending portion, which reduces the module assembly yield of the product (the product yield).

Based on the above problems, an embodiment of the present disclosure provides a display device. The display device includes a display portion and a bending portion located on at least one side of the display portion; a second substrate, where the second substrate and the first substrate are disposed opposite to each other, the second substrate includes a first region portion corresponding to the bending portion, and the bending portion is bent towards one side facing away from the second substrate; and a protective layer, where the protective layer is located at least between the bending portion and the first region portion, and a first end of the protective layer is separated from the bending portion and/or the first region portion. With the above technical solutions, the protective layer between the bending portion of the first substrate and the first region portion of the second substrate, and the bending portion of the first substrate is bent towards one side of the second substrate, so that the first end of the protective layer is separated from the bending portion and/or the first region portion, which plays a role of releasing the extrusion stress and protecting the traces in the bending portion, thereby reducing the risk of trace breakage in the bending portion and improving the module assembly yield.

The above is the core concept of the present disclosure, and technical solutions in embodiments of the present disclosure will be described clearly and completely in conjunction with the drawings in embodiments of the present disclosure.

Figure 3:
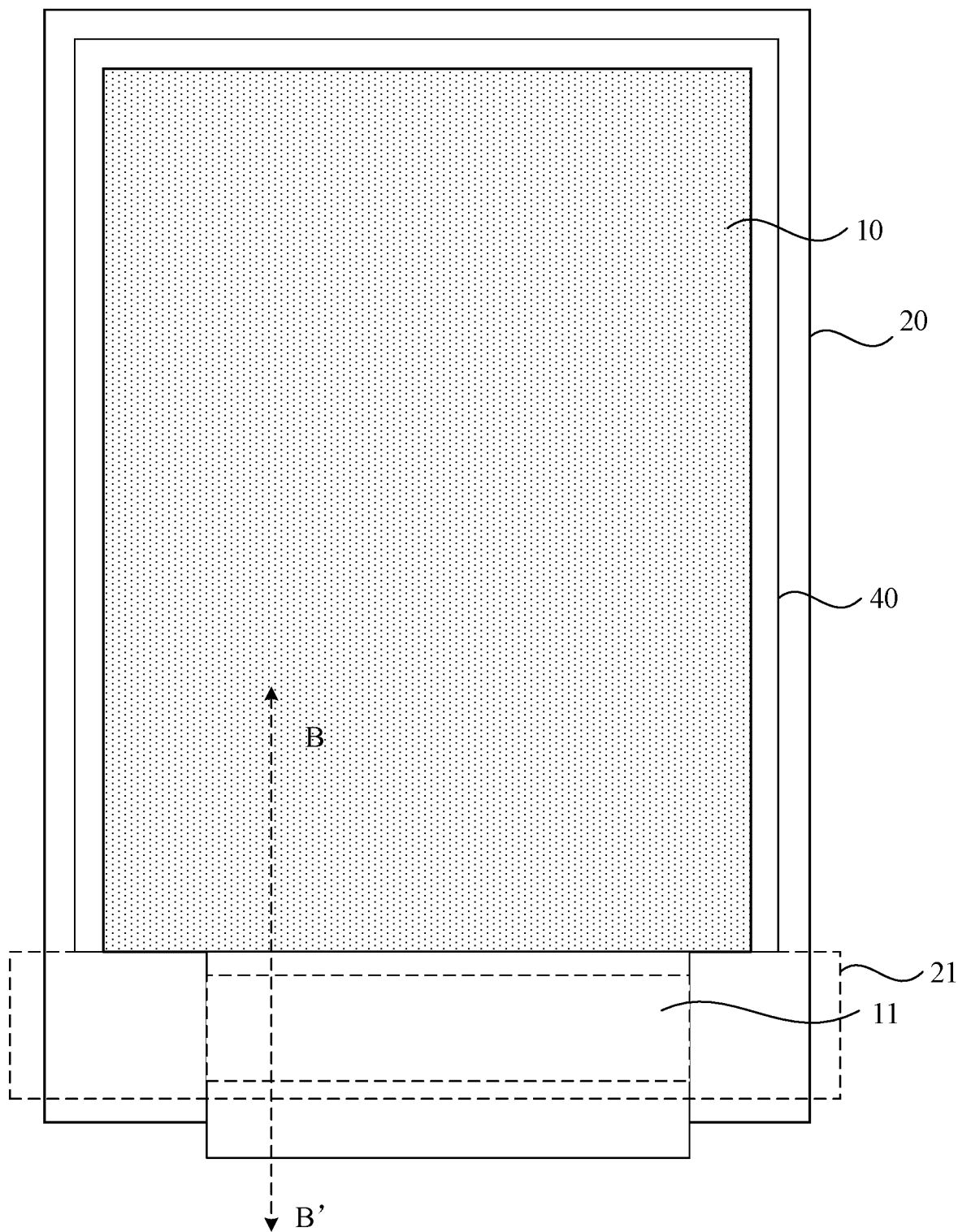
FIG. 3 is a top view of a display device provided by an embodiment of the present disclosure.
Figure 4:
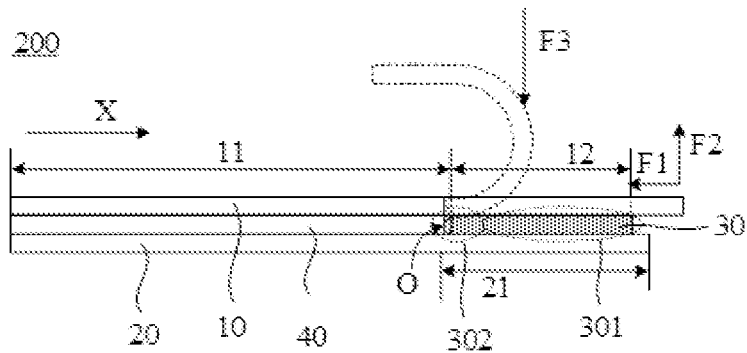
FIG. 4 is a sectional view of a display device taken along a direction BB' in FIG. 3.
Figure 5:
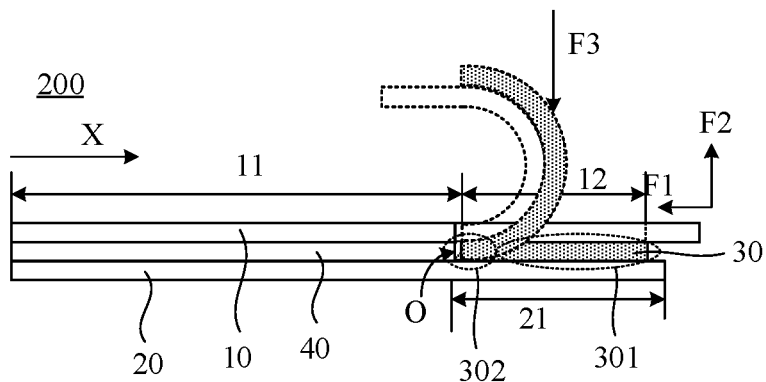
FIG. 5 is a sectional view of another display device taken along a direction BB' in FIG. 3.
Figure 6:
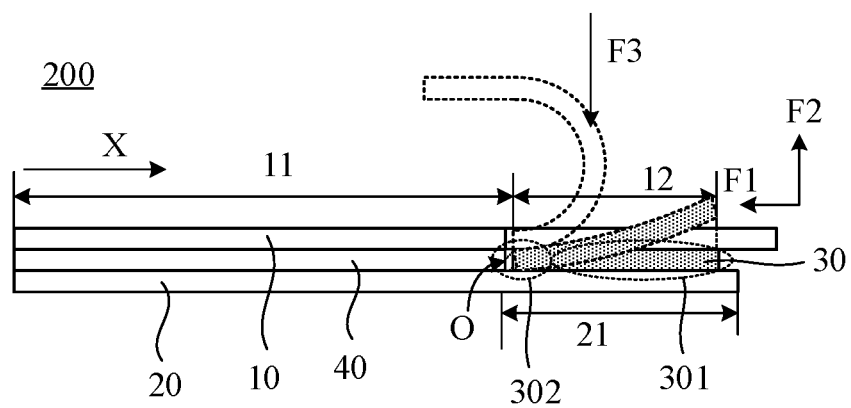
FIG. 6 is a sectional view of another display device taken along a direction BB' in FIG. 3.

FIG. 3 is a top view of a display device provided by an embodiment of the present disclosure. FIG. 4 is a sectional view of a display device taken along a direction BB' in FIG. 3. FIG. 5 is a sectional view of another display device taken along a direction BB' in FIG. 3. FIG. 6 is a sectional view of another display device taken along a direction BB' in FIG. 3. With reference to FIGS. 3 to 6, an embodiment of the present disclosure provides a display device. The display device 200 includes a first substrate 10, where the first substrate 10 includes a display portion 11 and a bending portion 12 located on at least one side of the display portion 11; a second substrate 20, where the second substrate 20 and the first substrate 10 are disposed opposite to each other, the second substrate 20 includes a first region portion 21 corresponding to the bending portion 12, and the bending portion 12 is bent towards one side facing away from the second substrate 20; and a protective layer 30, where the protective layer 30 is located at least between the bending portion 12 and the first region portion 21, and a first end of the protective layer 30 is separated from the bending portion 12 and/or the first region portion 21.

In an embodiment, with reference to FIGS. 2 to 6, the display device 200 provided by the embodiment of the present disclosure includes the first substrate 10 and the second substrate 20. The second substrate 20 and the first substrate 10 are disposed opposite to each other. The first substrate 10 may be a display module (a light-emitting module) of the display device, and the second substrate 20 may be a cover glass of the display device. FIG. 3 is a top view along a light-emitting side of the display module to a cover glass side. The display device may be a liquid crystal display device or an active light-emitting display device, such as an organic light emitting diode display (OLED), a micro light emitting diode display (Micro LED), an active-matrix organic light emitting diode (AMOLED) and the like. For example, the display device may be a liquid crystal display device. The liquid crystal display device generally includes a liquid crystal display panel and a backlight module disposed on a back of the liquid crystal display panel, and the backlight module may be used for providing a backlight for the liquid crystal display panel. The first substrate may be an array substrate of the liquid crystal display panel. The second substrate is a color filter substrate. The array substrate is provided with an array circuit for driving pixels in the display portion 11, such as a thin film transistor (TFT) circuit. The color film substrate includes structures such as a filter, a black matrix and the like, a liquid crystal layer is disposed between the array substrate and the color film substrate. The liquid crystal itself cannot emit light, and a working principle of the liquid crystal display device is that liquid crystal molecules in the liquid crystal layer are controlled to rotate by applying a driving voltage, light emitted by the backlight module passes through a TFT array substrate of the liquid crystal display panel, and refracts from the liquid crystal layer of the liquid crystal display panel, so as to generate a color picture through a CF substrate. In a case where the display device provided by the embodiment of the present disclosure is an organic light-emitting display device, the first substrate 10 may also include an array substrate, and the array substrate 30 may include structures such as a TFT array, an organic light-emitting device and the like, and a driving circuit between the substrate and the organic light-emitting device. The driving circuit may include multiple thin film transistors and capacitors, such as a 7T1C circuit. The specific form of the driving circuit is not limited by the embodiment of the present disclosure. The second substrate may be an encapsulation substrate for protecting the organic light emitting device. The display panel provided by the embodiment of the present disclosure may be a liquid crystal display panel or an organic light-emitting display panel, and the array substrate may be a rigid substrate or a flexible substrate, which is not limited by the embodiment of the present disclosure.

The first substrate 10 includes a display portion 11 and a bending portion 12 located at least one side of the display portion 11. It is understood that the display portion 11 may also include multiple pixels (not shown in FIG. 3) for displaying a picture to be displayed. The bending portion 12 may be used for connecting the display portion 11 and a display driving circuit (IC), and may be provided with multiple signal lines connected to the display portion 11 for transmitting signals of the driving circuit. The second substrate 20 includes a first region portion 21 corresponding to the bending portion 12 for protecting the bending portion 12. To reduce the risk of trace breakage caused by a force applied on the bending portion, the protective layer 30 is added. The protective layer 30 may be a buffer flexible material. The protective layer 30 is disposed at least between the bending portion 12 and the first region portion 21. The protective layer 30 can play a role of fixing the bending portion 12 and improving the extrusion resistance ability of the bending portion 12. Before the bending portion 12 is bent, the protective layer 30 may be connected to the bending portion 12 and the first region portion 21 separately so as to fix the bending portion 12. In a case where the bending portion 12 is bent, the protective layer 30 may, on the one hand, play a role of fixing the bending portion 12 and improving the extrusion resistance ability of the bending portion 12, and on the other hand, release a part of the bending stress and reduce the risk of trace breakage of the bending portion 12. In a case where the bending portion 12 is bent towards one side facing away from the second substrate 20, it may be configured that a first end 301 of the protective layer 30 is separated from at least a partial area of the bending portion 12. As shown in FIG. 4, in an embodiment, the first end 301 of the protective layer 30 may be separated from an entire area of the bending portion 12; or the first end 301 of the protective layer 30 is separated from at least a partial area of the first region portion 21. As shown in FIG. 5, in an embodiment, the first end 301 of the protective layer 30 is separated from an entire area of the first region portion 21; or the first end 301 of the protective layer 30 is separated from at least a partial area of the bending portion 12 and at least a partial area of the first region portion 21. As shown in FIG. 6, in an embodiment, the first end 301 of the protective layer 30 is separated from an entire area of the bending portion 12 and an entire area of the first region portion 21 to complete the bending preparation of the bending portion 12 of the display device to one side. The protective layer 30 is configured with the above structure, which can reduce the risk of trace breakage in the bending portion and improve the module assembly yield. In an embodiment, the first end 301 of the protective layer is an end of the protective layer away from the display portion 11.

It is to be noted that the display device provided by the embodiment of the present disclosure may also include other film layers, which work together to achieve the display function of the display device, and is not described one by one herein.

In summary, in the display device provided by the embodiment of the present disclosure, the protective layer is disposed between the bending portion of the first substrate and the first region portion of the second substrate, which can play a role of fixing the bending portion and improving the extrusion resistance ability of the bending portion, and at the same time, can reduce the risk of trace breakage in the bending portion and improve the module assembly yield.

In an embodiment, the display device 200 also includes an optical adhesive 40, and a gap O is provided between an edge of the protective layer 30 close to one side of the display portion 11 and the optical adhesive 40.

As shown in FIGS. 3 to 6, the display device 200 provided by the embodiment of the present disclosure further includes the optical adhesive 40. The optical adhesive 40 may be a UV adhesive or a frame adhesive, and may cover a position corresponding to the display portion 11 entirely or form the frame adhesive around an edge region of the display portion 11 for encapsulating the display portion 11. The protective layer 30 may be prepared on a same base film as the optical adhesive 40, and the gap O is provided between the edge of the protective layer 30 close to the display portion 11 and the optical adhesive 40, as shown in a region indicated by an arrow in the figure. In practice, the gap O may range from 0.1 mm to 0.3 mm in an X direction in the figure, so as to provide a deformation space for the protective layer 30 in a case where the protective layer 30 is bent with the bending portion 12 to reduce the possible influence on the display portion 11 in a case where the protective layer 30 is bent.

Figure 7:
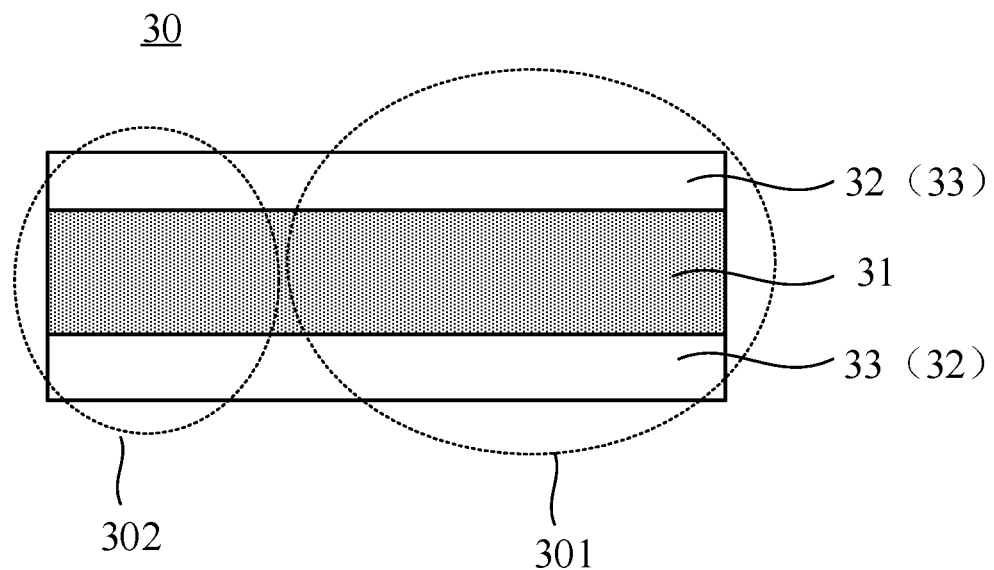
FIG. 7 is a structure diagram of a protective layer provided by an embodiment of the present disclosure.
Figure 8:
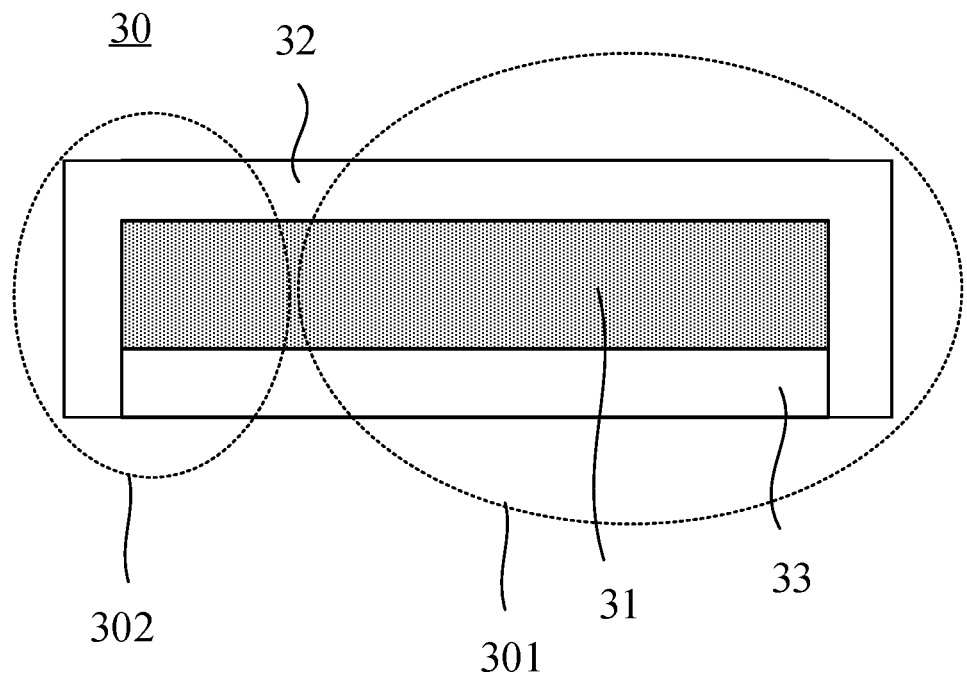
FIG. 8 is another structure diagram of a protective layer provided by an embodiment of the present disclosure.
Figure 9:
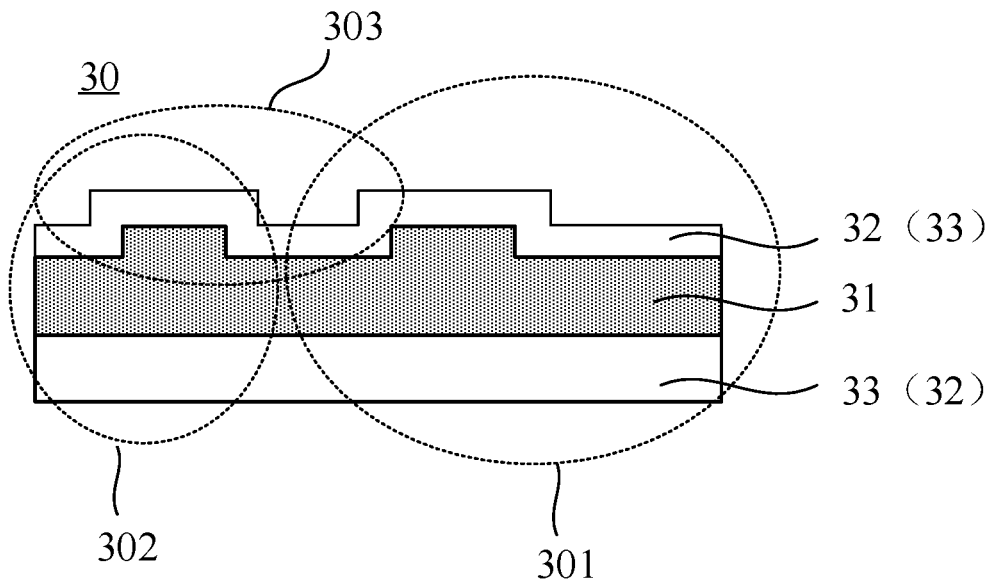
FIG. 9 is another structure diagram of a protective layer provided by an embodiment of the present disclosure.

FIG. 7 is a structure diagram of a protective layer provided by an embodiment of the present disclosure. FIG. 8 is another structure diagram of a protective layer provided by an embodiment of the present disclosure. FIG. 9 is another structure diagram of a protective layer provided by an embodiment of the present disclosure. With reference to FIGS. 7 to 9, in an embodiment, the protective layer 30 may include a buffer layer 31 and a first adhesive layer 32 and a second adhesive layer 33, and the first adhesive layer 32 and the second adhesive layer 33 are located on two sides of the buffer layer respectively. A viscosity of the first adhesive layer 32 is less than a viscosity of the second adhesive layer 33.

In an embodiment, with reference to FIGS. 3 to 9, the protective layer 30 is configured as a three-layer structure, including the buffer layer 31, the first adhesive layer 32 and the second adhesive layer 33, and the first adhesive layer 32 and the second adhesive layer 33 are located on two sides of the buffer layer 31 respectively. The buffer layer 31 may be a buffer flexible material. In an embodiment, the buffer layer 31 includes a foam. In a case where the bending portion 12 is bent, the foam of the buffer layer 31 plays a buffering role to improve the strength of the bending portion 12. In a case where the bending portion 12 is subjected to an external force in an F3 direction after the bending is completed, the foam of the buffer layer 31 may also play a role of buffering, thereby reducing the risk of cracks in the bending portion caused by the severe deformation. The viscosity of the first adhesive layer 32 is less than the viscosity of the second adhesive layer 33. In an embodiment, the first adhesive layer 32 includes a reduction adhesive. A viscosity of the viscose reduction adhesive is reduced in a case where the viscose reduction adhesive is heated or irradiated by an ultraviolet light. For example, before the bending portion 12 of the first substrate 10 is bent, the viscose reduction adhesive may be adhered to one side of the bending portion 12 to play a role of fixing the bending portion 12. In a case where the bending portion 12 needs to be bent, the first adhesive layer 32 may be heated or irradiated by the ultraviolet light to reduce or eliminate the viscosity of the reduction adhesive, and the viscose reduction adhesive may be structurally separated from the bending portion 12 without damaging a surface structure of the bending portion 12.

In an embodiment, an area of the viscose reduction adhesive is larger than an area of the buffer layer. As shown in FIG. 8, a contact area between the viscose reduction adhesive and the buffer layer is increased. When heated or irradiated by the ultraviolet light, the viscosity between the viscose reduction adhesive and the buffer layer 31 is weakened, and the buffer layer 31 overflows, so that the viscose reduction adhesive and the buffer layer 31 move at the same time in a case where the bending portion 12 is bent.

Further, in an embodiment, the viscose reduction adhesive at least partially covers side walls of the buffer layer. The viscose reduction adhesive may be configured to cover the side walls of the buffer layer 31, as shown in FIG. 8, or partially cover the side walls (not shown in the figure) of the buffer layer 31, increasing the contact area between viscose reduction adhesive and the buffer layer.

For example, with reference to FIGS. 4 to 9, the second substrate 20 may be a cover glass, the optical adhesive 40 and the protective layer 30 may be attached to the second substrate 20 first, and then the first substrate 10 is attached to the second substrate 20. In the preparation process, in a case where the bending portion 12 of the first substrate 10 is subjected to forces in F1 and F2 directions, the protective layer may ensure that the bending portion 12 is fixed on the second substrate 20, preventing the bending portion 12 from line breakage due to the severe deformation. Before bending the bending portion 12 of the first substrate 10, the first adhesive layer 32 may be heated or irradiated by the ultraviolet light so that a viscosity of an adhesive surface adhered to the bending portion 12 is reduced or even failed. The adhesive surface may be one side of the bending portion 12 or one side of the first region portion 21 so as to bend the bending portion 12.

With continued reference to FIGS. 3 to 9, in an embodiment, the first end 301 of the buffer layer 30 is attached to the first region portion 21 or the bending portion 12 through the second adhesive layer 33. The second adhesive layer 33 may be a common double-sided adhesive with a certain viscosity, and the viscose reduction adhesive, foam, ad double-sided adhesive form a three-layer sandwich structure of double-sided foam adhesive. After the bending portion 12 is bent, the first end 301 of the buffer layer 30 may be attached to the first region portion 21 of the second substrate 20 through the second adhesive layer 33, as shown in FIG. 4; or to the bending portion 12 of the first substrate 10 through the second adhesive layer 33, as shown in FIG. 5; or the second adhesive layer 33 in a region of the first end 301 of the buffer layer 30 is separated from both the first region portion 21 and the bending portion 12 during the bending process, thereby forming the structure shown in FIG. 6.

On the basis of the above embodiment, as shown in FIGS. 5 to 9, in an embodiment, in a case where the protective layer 30 is attached to the first substrate 10, the protective layer covers at least part of a boundary of the bending portion 12. The boundary of the bending portion 12 may be one side close to the display portion 11. In a case where the bending portion 12 is bent, a pressure applied on the bending portion is relatively large. One end of the protective layer close to the display portion 11 is attached to both the first substrate and the second substrate, which plays a role of fixing the bending portion 12 to a certain extent, and reduces pulling a displacement deformation crack of the bending portion 12. In an embodiment, when the bending portion 12 is bent, the protective layer 30 may be bonded to cover at least part of the boundary of the bending portion 12, so as to improve the fixing and buffering effect on the bending portion 12. The specific bonding coverage range is not limited here and can be configured according to the size of the bending portion 12 of the display device.

Further, as shown in FIGS. 3 to 9, in an embodiment, a second end 302 of the protective layer 30 is bonded to the first substrate 10 and the second substrate 20 separately. The second end 302 of the protective layer 30 is bonded to the first substrate 10 and the second substrate 20 through the first adhesive layer 32 or the second adhesive layer 33, so that the protective layer 30 can fix and protect the bending portion 12 before and after the bending portion 12 is bent. In an embodiment, the second end 302 of the protective layer 30 is an end of the protective layer close to the display portion 11.

On the basis of the above embodiment, referring to FIG. 9, in an embodiment, a concave-convex structure 303 is disposed on one side of the protective layer 30 close to the bending portion 12, and the concave-convex structure 303 matches a film layer of the bending portion 12. In an embodiment, according to the film layer structure of the bending portion 12, the concave-convex structure 303 is disposed on one side of the protective layer 30 close to the bending portion 12. The concave-convex structure 303 may be disposed on one side of the protective layer 30 close to the bending portion 12 or in the region of the first end 301 of the protective layer 30. Meanwhile, the concave-convex structure 303 may cover the first/second adhesive layer and the buffer layer 31 so as to match the film layer of the bending portion 12 and play a role of protecting the film layer structure of the bending portion 12.

It is to be noted that the first end 301 and the second end 302 of the protective layer 30 are not clearly defined, and can be flexibly configured according to a range of the bending portion 12, so that the protective layer 30 can fix the bending portion 12 and decrease cracks in the bending portion 12 caused by pulling and bending forces.

Figure 10:
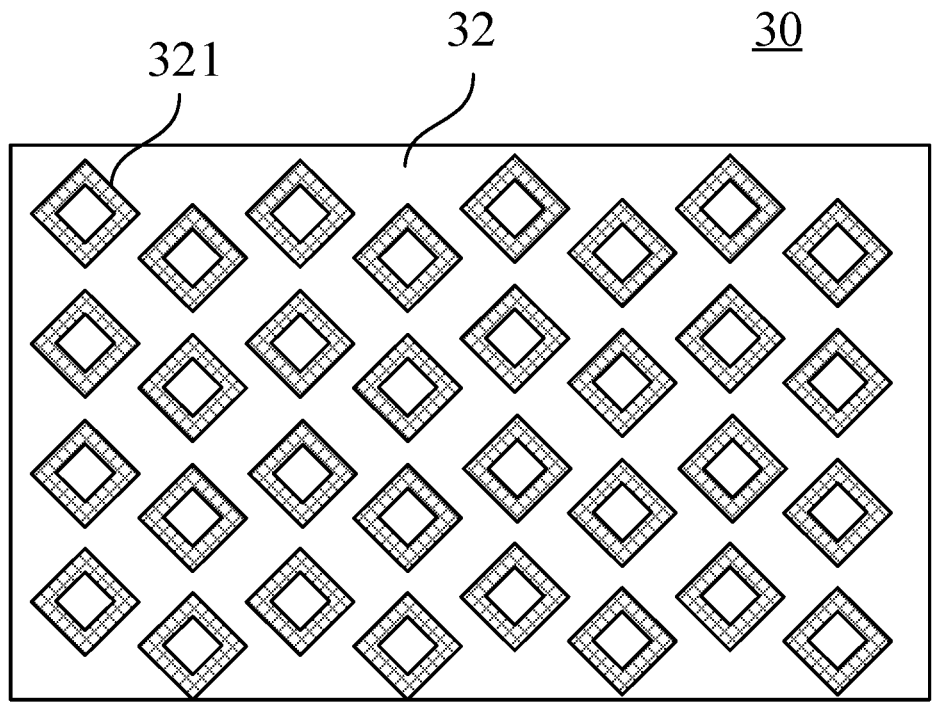
FIG. 10 is a top view of a protective layer provided by an embodiment of the present disclosure.
Figure 11:
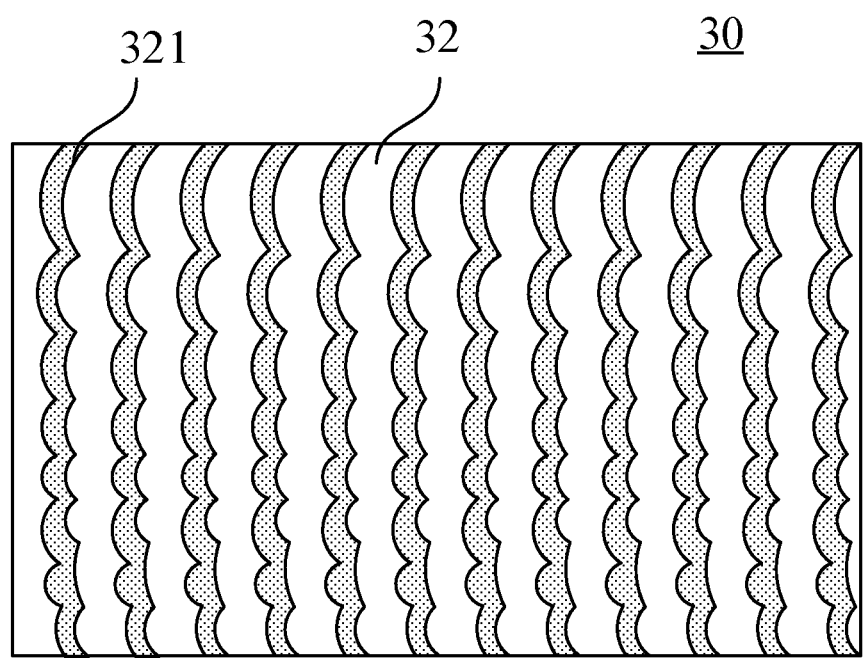
FIG. 11 is another top view of a protective layer provided by an embodiment of the present disclosure.

FIG. 10 is a top view of a protective layer provided by an embodiment of the present disclosure. FIG. 11 is another top view of a protective layer provided by an embodiment of the present disclosure. On the basis of the above embodiment, with reference to FIGS. 4 to 11, in an embodiment, the first adhesive layer 32 includes a hollow portion 321.

In an embodiment, as shown in FIGS. 10 and 11, the hollow portion 321 is disposed in the first adhesive layer 32 of the protective layer 30, and the hollow portion 321 may be in a shape of a circle, a triangle, a rhombus, a curve, a polyline, a grid and the like. FIGS. 10 and 11 just show examples in which the hollow portion 321 is in the shape of a rhombus and a curve, and more examples will not be fully illustrated here. The hollow portion 321 is disposed in the first adhesive layer 32, which facilitates reducing the viscosity of the viscose reduction adhesive in the case where the viscose reduction adhesive is heated or irradiated by the ultraviolet light, and when the bending portion 12 is bent, the viscose reduction adhesive is peeled off from the bending portion 12 or the first region portion 21.

On the basis of the above embodiment, with reference to FIGS. 4, 7 to 11, in an embodiment, in a case where the protective layer 30 is attached to the second substrate 20, the second substrate 20 covers the protective layer 30.

In an embodiment, in a case where the first end 301 of the protective layer 30 is separated from the bending portion 12, and the protective layer 30 is attached to the second substrate 20, the second substrate 20 is configured to cover the protective layer 30, which controls the size of the protective layer 30 while the protective layer plays a role of fixing the bending portion 12, so as to avoid affecting other preparation processes of the display device due to the oversize of the protective layer 30.

Figure 12:
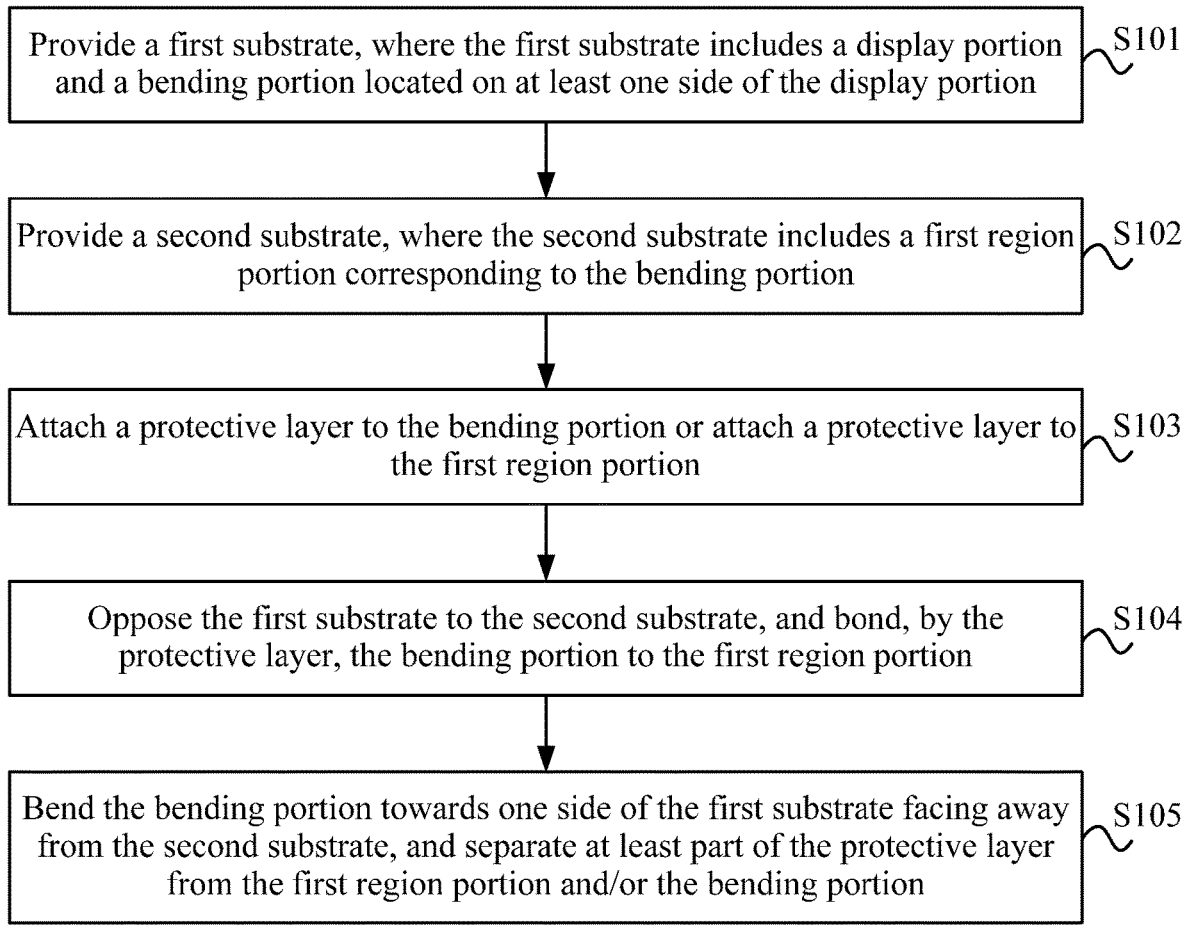
FIG. 12 is a flowchart of a preparation method of a display device provided by an embodiment of the present disclosure.

Based on the same inventive concept, an embodiment of the present disclosure further provides a preparation method of a display device. FIG. 12 is a flowchart of a preparation method of a display device provided by an embodiment of the present disclosure. FIGS. 13 to 17 are flowcharts of a preparation process corresponding to the preparation method provided in FIG. 12. With reference to FIGS. 3 to 17, the preparation method of the display device provided by the embodiment of the present disclosure includes the steps described below.

In step S101, a first substrate is provided. The first substrate includes a display portion and a bending portion located on at least one side of the display portion.

Figure 13:
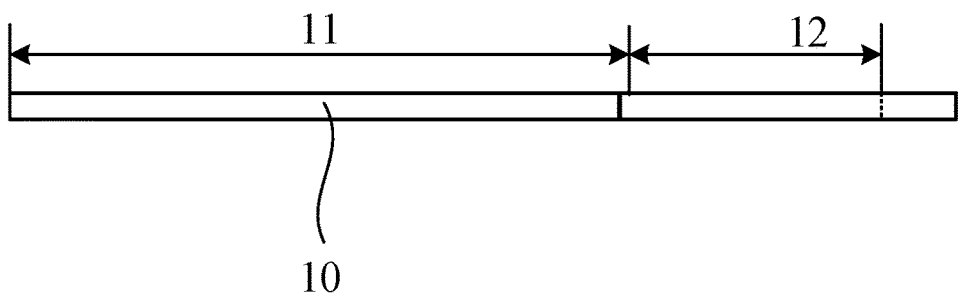
FIGS. 13 to 17 are flowcharts of a preparation process corresponding to the preparation method provided in FIG. 12.

In an embodiment, as shown in FIG. 13, the display device may include a liquid crystal display panel, an organic light-emitting display panel, a micro light emitting diode display and the like. The first substrate 10 may include an array substrate. The array substrate is provided with an array circuit for driving pixels in the display portion 11. The first substrate 10 includes the display portion 11 and the bending portion 12 located on at least one side of the display portion 11, and the bending portion 12 may be provided with multiple types of connection signal traces.

In step S102, a second substrate is provided. The second substrate includes a first region portion corresponding to the bending portion.

Figure 14:
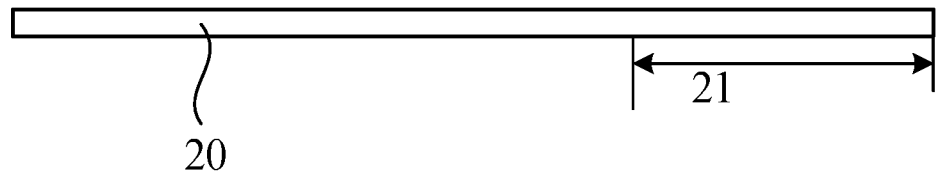

In an embodiment, as shown in FIG. 14, the display device may include the liquid crystal display panel and the second substrate 20 may be a color film substrate; or the display device may include the organic light-emitting display panel, the second substrate 20 may be an encapsulation substrate, and the second substrate 20 includes the first region portion 21 corresponding to the bending portion 12.

In step S103, the protective layer is attached to the bending portion or the protective layer is attached to the first region portion.

Figure 15:
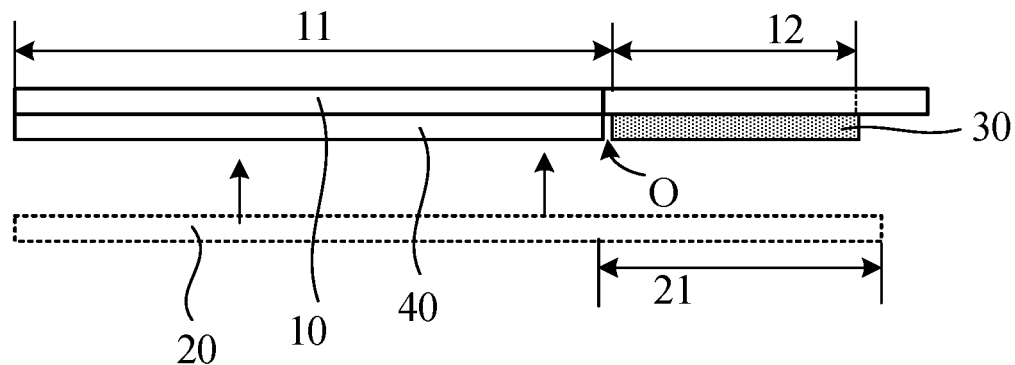
Figure 16:
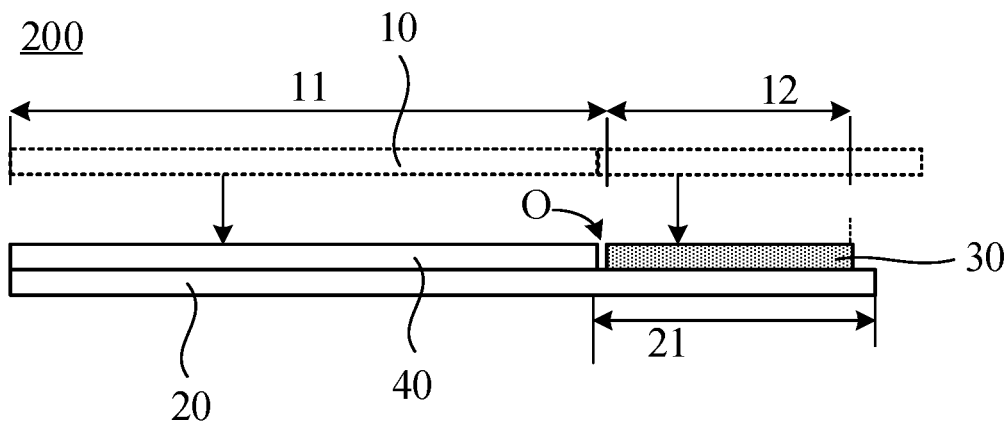

In an embodiment, the protective layer 30 may be attached to one side of the bending portion 12 of the first substrate 10, as shown in FIG. 15; or the protective layer 30 is attached to one side of the first region portion 21 of the second substrate 20, as shown in FIG. 16.

In step S104, the first substrate is opposed to the second substrate, and the bending portion is bonded to the first region portion by the protective layer.

Figure 17:
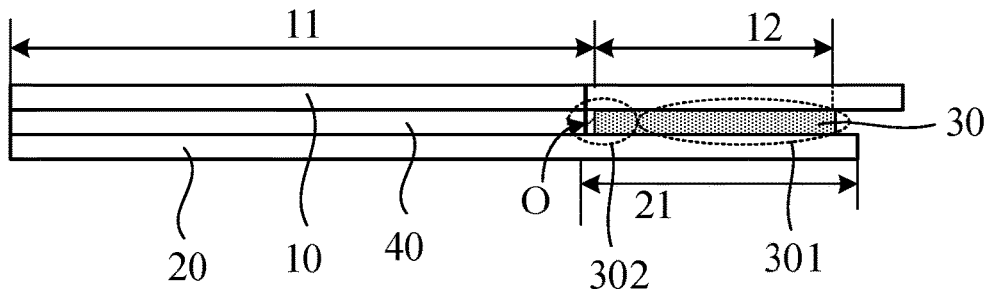

In an embodiment, as shown in FIGS. 15 and 16, the first substrate 10 is opposed to the second substrate 20, and the bending portion 12 is bonded to the first region portion 21 by the protective layer 30 to form the structure shown in FIG. 17.

In step S105, the bending portion is bent towards one side of the first substrate facing away from the second substrate, and at least part of the protective layer is separated from the first region portion and/or the bending portion.

In an embodiment, as shown in FIG. 17, the bending portion 12 is bent towards one side of the first substrate 10 facing away from the second substrate 20. During the bending process, the protective layer 30 plays a role of fixing the bending portion and improving the extrusion bearing strength of the bending portion, which can reduce the generation of cracks in the bending portion. After bending, with reference to FIGS. 4 to 6, at least part of the protective layer 30 is separated from the first region portion 21, as shown in FIG. 4; or separated from the bending portion 12, as shown in FIG. 5; or separate from both the first region portion 21 and the bending portion 12, as shown in FIG. 6.

In summary, in the preparation method of the display device provided by the embodiment of the present disclosure, the protective layer is attached between the bending portion of the first substrate and the first region portion of the second substrate. When the bending portion of the first substrate is bent, the protective layer plays a role of fixing the bending portion and improving the extrusion resistance ability of the bending portion, thereby protecting the traces in the bending portion, avoiding the trace breakage in the bending portion and improving the module assembly yield.

On the basis of the embodiments described above, with reference to FIGS. 7 to 9, in an embodiment, the protective layer 30 includes a buffer layer 31 and a first adhesive layer 32 and a second adhesive layer 33, and the first adhesive layer 32 and the second adhesive layer 33 are located on two sides of the buffer layer respectively. A viscosity of the first adhesive layer 32 is less than a viscosity of the second adhesive layer 33. As described in the above embodiments, the first adhesive layer 32 may be a viscose reduction adhesive, the second adhesive layer 33 may be a common double-sided adhesive and the buffer layer 31 may be a foam. A viscosity of the viscose reduction adhesive is less than a viscosity of the common double-sided adhesive.

The step in which the protective layer is attached to the bending portion or the protective layer is attached to the first region portion includes the steps descried below.

The first adhesive layer of the protective layer is attached to the bending portion or the first adhesive layer of the protective layer is attached to the first region portion.

In an embodiment, with reference to FIGS. 7 to 9, FIGS. 15 and 16, the first adhesive layer 32 of the protective layer 30 may be attached to the bending portion 12 or the first region portion 21, so that after the first substrate 10 is opposed to the second substrate 20, the bending portion 12 is bonded to the first region portion 21 by the protective layer 30.

Figure 18:
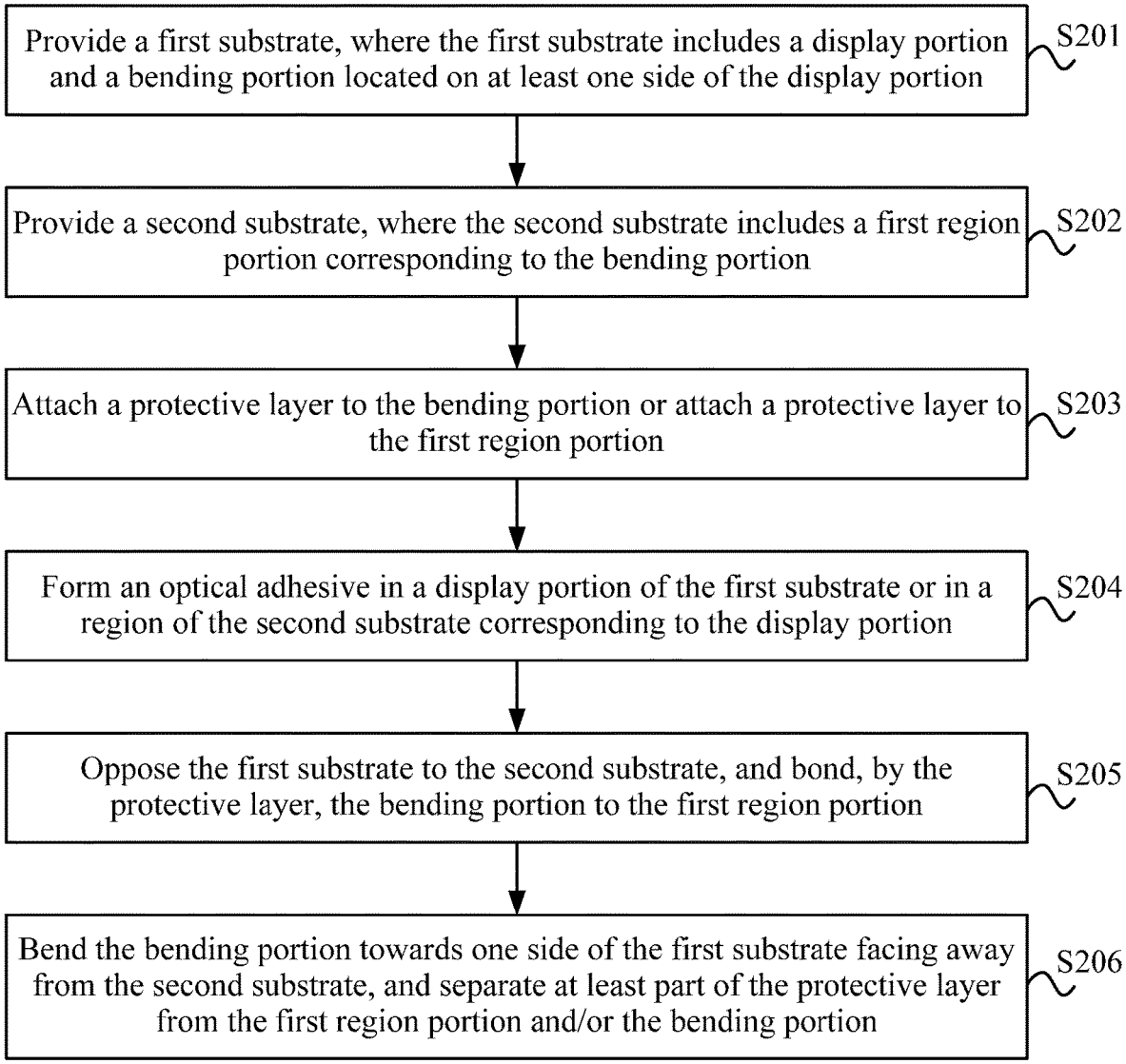
FIG. 18 is a flowchart of another preparation method of a display device provided by an embodiment of the present disclosure.

FIG. 18 is a flowchart of another preparation method of a display device provided by an embodiment of the present disclosure. With reference to FIGS. 13 to 17, and FIGS. 4 to 6, the preparation method of the display device provided by the embodiment of the present disclosure includes the steps described below.

In step S201, a first substrate is provided. The first substrate includes a display portion and a bending portion located on at least one side of the display portion, referring to FIG. 13.

In step S202, a second substrate is provided. The second substrate includes a first region portion corresponding to the bending portion, referring to FIG. 14.

In step S203, the protective layer is attached to the bending portion or the first region portion, referring to FIGS. 15 and 16.

In step S204, an optical adhesive is formed in a display portion of the first substrate or in a region of the second substrate corresponding to the display portion.

In an embodiment, with continued reference to FIGS. 15 and 16, the optical adhesive 40 is formed in the display portion 11 of the first substrate 10 before or after the protective layer 30 is attached as shown in FIG. 15; or the optical adhesive 40 is formed in the region of the second substrate 20 corresponding to the display portion 11, as shown in FIG. 16, and the optical adhesive 40 is used for encapsulating the display portion 11.

With continued reference to FIGS. 15 and 16, in an embodiment, the optical adhesive 40 and the protective layer 30 are formed on a same base film. The original spatial structure of the optical adhesive 40 is used, the protective layer 30 is added, and thicknesses of the optical adhesive 40 and the protective layer 30 are controlled to be consistent, so that the bending portion 12 is fixed without changing the film layer structure of the display device, thereby reducing cracks in the bending portion 12, preventing the signal lines in the bending portion 12 from breaking, and ensuring the display effect.

In step S205, the first substrate is opposed to the second substrate, and the bending portion is bonded to the first region portion by the protective layer, referring to FIGS. 15 and 17.

In step S206, the bending portion is bent towards one side of the first substrate facing away from the second substrate, and at least part of the protective layer is separated from the first region portion and/or the bending portion, referring to FIGS. 4 to 6 and 17.

In summary, the display device prepared by using the preparation method of the display device provided by the embodiment of the present disclosure has less risk of trace breakage caused by pulling the bending portion in the preparation process of the flexible module, so that the flexible module has a higher assembly yield.

Figure 19:
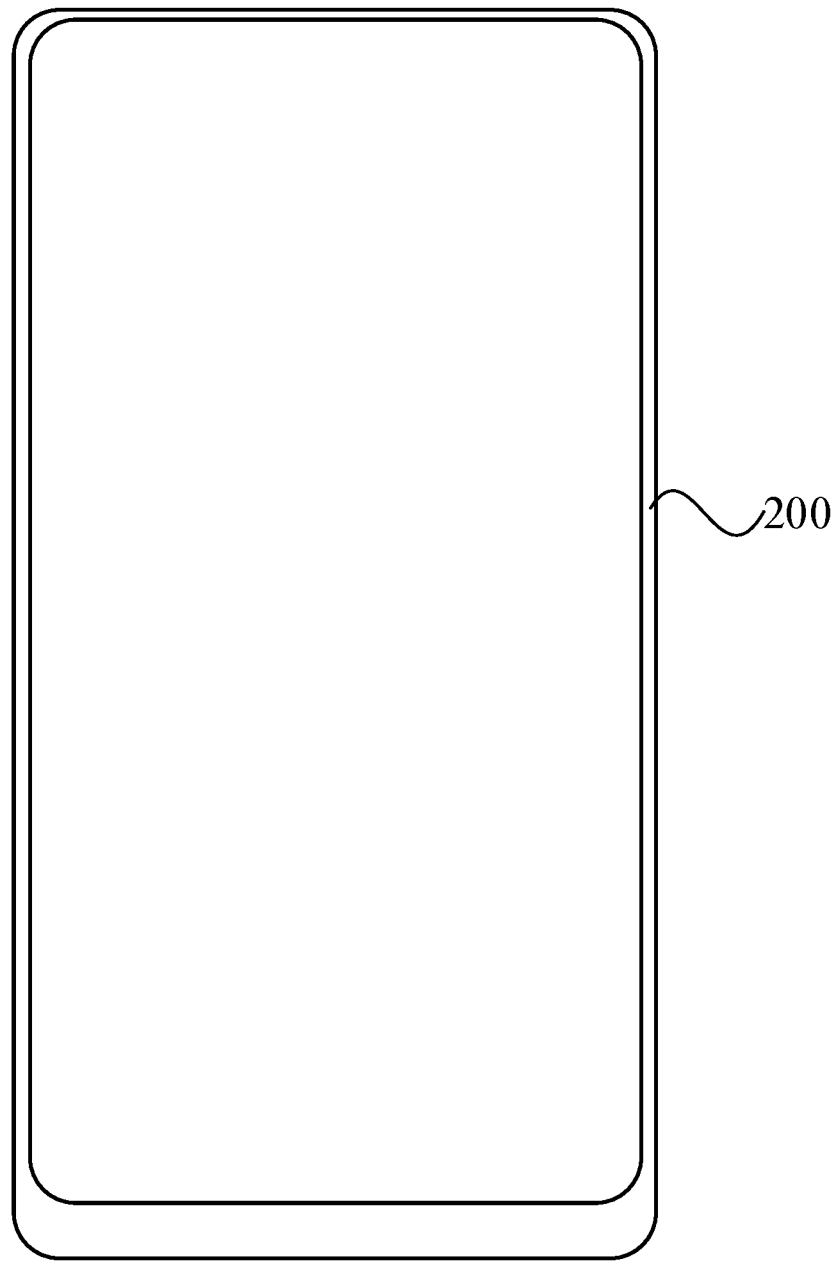
FIG. 19 is a structure diagram of a display device provided by an embodiment of the present disclosure.

FIG. 19 is a structure diagram of a display device provided by an embodiment of the present disclosure. As shown in FIG. 19, the display device provided by the embodiments of the present disclosure may be the phone shown, or may be any electronic product with display function, including but not limited to the following categories: television, laptop, desktop display, tablet computer, digital camera, smart bracelet, smart glasses, vehicle-mounted display, medical equipment, industrial control equipment, touch interactive terminal, etc., and no special limitations are made thereto in the embodiments of the present disclosure.

It is to be noted that the preceding are only preferred embodiments of the present disclosure and technical principles used therein. It is to be understood by those skilled in the art that the present disclosure is not limited to the embodiments described herein. For those skilled in the art, various apparent modifications, adaptations, combinations, and substitutions can be made without departing from the scope of the present disclosure. Therefore, while the present disclosure has been described in detail via the preceding embodiments, the present disclosure is not limited to the preceding embodiments and may include more equivalent embodiments without departing from the inventive concept of the present disclosure. The scope of the present disclosure is determined by the scope of the appended claims.

What is claimed is:

1. A display device, comprising:
   a first substrate, wherein the first substrate comprises a display portion and a bending portion located on at least one side of the display portion;
   a second substrate, wherein the second substrate and the first substrate are disposed opposite to each other, the second substrate comprises a first region portion corresponding to the bending portion, and the bending portion is bent towards one side facing away from the second substrate; and
   a protective layer, wherein the protective layer is located at least between the bending portion and the first region portion, and a first end of the protective layer is separated from at least one of the bending portion or the first region portion
   wherein a second end of the protective layer is bonded to the first substrate and the second end of the protective layer is bonded to the second substrate.

2. The display device of claim 1, wherein the protective layer comprises a buffer layer, a first adhesive layer and a second adhesive layer, and the first adhesive layer and the second adhesive layer are located on two sides of the buffer layer respectively; and
   a viscosity of the first adhesive layer is less than a viscosity of the second adhesive layer.

3. The display device of claim 2, wherein a first end of the buffer layer is attached to the first region portion or the bending portion through the second adhesive layer.

4. The display device of claim 2, wherein the first adhesive layer comprises a viscose reduction adhesive.

5. The display device of claim 4, wherein a viscosity of the viscose reduction adhesive is reduced when the viscose reduction adhesive is heated or irradiated by an ultraviolet light.

6. The display device of claim 4, wherein an area of the viscose reduction adhesive is greater than an area of the buffer layer.

7. The display device of claim 6, wherein the viscose reduction adhesive at least partially covers a side wall of the buffer layer.

8. The display device of claim 2, wherein the buffer layer comprises a foam.

9. The display device of claim 2, wherein when the protective layer is attached to the first substrate, the first adhesive layer covers at least part of a boundary of the bending portion.

10. The display device of claim 2, wherein the first adhesive layer comprises a hollow portion.

11. The display device of claim 1, further comprising: an optical adhesive, and a gap is provided between an edge of the protective layer close to one side of the display portion and the optical adhesive.

12. The display device of claim 1, wherein when the protective layer is attached to the second substrate, the second adhesive layer covers the protective layer.

13. The display device of claim 1, wherein a concave-convex structure is disposed on one side of the protective layer close to the bending portion, and the concave-convex structure matches a film layer of the bending portion.

* * * * *